(12) United States Patent
Fetzer et al.

(10) Patent No.: US 6,864,433 B1
(45) Date of Patent: Mar. 8, 2005

(54) CIRCUIT BOARD CLIP APPARATUS AND METHOD

(75) Inventors: Barry A. Fetzer, Renton, WA (US); Mark A. Negley, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/768,032

(22) Filed: Feb. 2, 2004

(51) Int. Cl.$^7$ .................................................. H05K 1/11
(52) U.S. Cl. ........................... 174/138 G; 174/166 S; 361/742; 361/804
(58) Field of Search .................. 174/138 G, 166 S; 361/644, 645, 650, 651, 658, 736, 742, 748, 758, 801, 803, 804, 807; 403/408.1

(56) References Cited

U.S. PATENT DOCUMENTS

| | | | |
|---|---|---|---|
| 3,621,173 A | * | 11/1971 | O'Cheskey ............. 174/138 G |
| 3,996,500 A | * | 12/1976 | Coules ....................... 361/748 |
| 5,138,116 A | * | 8/1992 | Kabayama .............. 174/138 G |
| 5,398,166 A | * | 3/1995 | Yonezawa et al. .......... 361/758 |
| 5,544,006 A | * | 8/1996 | Radloff et al. .......... 174/138 G |
| 5,715,146 A | * | 2/1998 | Hoppal .................... 174/138 G |
| 5,775,418 A | * | 7/1998 | Lonergan et al. ....... 174/138 G |
| 5,847,923 A | * | 12/1998 | Lee ............................ 361/684 |
| 5,956,835 A | * | 9/1999 | Aksu ...................... 174/166 S |
| 6,749,072 B2 | * | 6/2004 | Takano et al. .............. 361/758 |
| 6,760,231 B2 | * | 7/2004 | Hung et al. ................. 361/758 |

* cited by examiner

Primary Examiner—Dean A. Reichard
Assistant Examiner—Adolfo Nino
(74) Attorney, Agent, or Firm—Baker & Hostetler LLP

(57) ABSTRACT

A circuit board clip apparatus having a base wherein the base includes a first end and a second. The clip apparatus also includes a bore that extends between the first and second ends of the base. The clip apparatus additionally includes a first leg coupled to the base. The first leg extends along the base and has an indent wherein the indent comprises a first finger portion and a second finger portion.

31 Claims, 6 Drawing Sheets

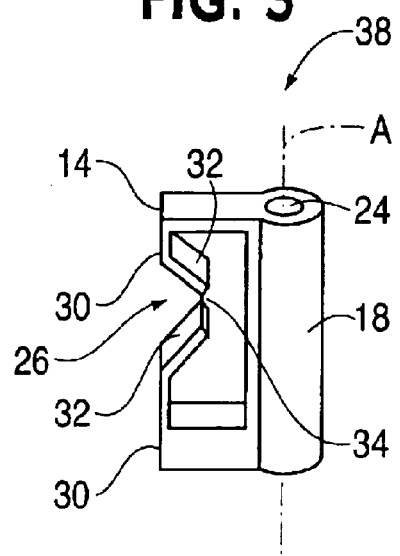
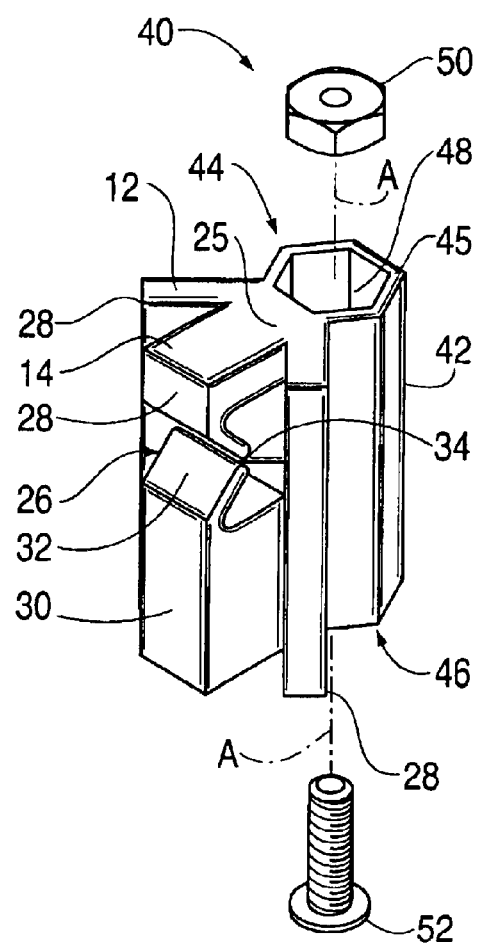

CIRCUIT BOARD CLIP APPARATUS AND METHOD

FIELD OF THE INVENTION

The present invention relates generally to the field of electronics and electronic circuitry boards. More particularly, the present invention relates to an apparatus and method for providing attachment and support for a circuit board, by way of, for example, a clip, which allows a circuit board to be mounted or connected to a chassis, frame, or the like.

BACKGROUND OF THE INVENTION

Circuit boards, such as printed circuit boards, are used in a variety of electronic systems or devices, such as computers and the like. The electronic devices are typically formed with an enclosure or chassis that includes one or more walls to which standoffs are mounted. The standoffs are designed to receive and support the circuit board at a desired spacing from the adjacent wall of the enclosure or chassis. Typically, the circuit boards are secured to the chassises via the standoffs using fasteners such as screws, that extend through holes drilled in the circuit boards for threaded engagement with the standoffs.

Generally, the mechanical connection of an individual circuit board to a chassis is designed to adequately secure the circuit board to the chassis and prevent it from becoming dislodged under anticipated mechanical service loads. The mechanical connection should also be designed so that it is easily operable allowing for the individual circuit boards to be easily and efficiently installed upon initial manufacture, and so that removal and replacement of the circuit boards for the purpose of maintenance is easily accomplished with reduced effort.

As previously mentioned, current methods in the art for attaching circuit boards to chassises or the like, include the use of screws through holes drilled in the circuit board. Typically, a screw is placed through a hole drilled through the circuit board, and screwed into the chassis. This method of screw attachment has drawbacks however.

Connection and/or attachment with screws through holes in the circuit board require relatively large periods of time to install and remove. Moreover, the insertion and removal of screws increases the risk of damage to the circuit board or components mounted on the circuit board. During installation of a circuit board, each screw must be tightened by a tool, and any slippage or inadvertent movement of the tool can damage the circuit board or its components. Also, if a screw is misdirected during installation and the screw is forced against a portion of the circuit board, damage to the circuit board and/or its components may be caused. Furthermore, loose screws may be dropped, lost or misplaced within the chassis or on the circuit board during installation or maintenance, which can cause further damage to the circuit boards.

The aforementioned screw attachment methods have additional drawbacks also, in that they require the circuit boards to have a plurality of holes drilled or punched through the circuit boards at various locations of the circuit boards through which the screws pass. The holes use up valuable surface area of the circuit boards where additional components may be placed. The holes are also permanent and fixed, and if for some reason the attachment points of the circuit board are not compatible with corresponding points of the chassis or frame, they cannot be adjusted and new holes must be punched or drilled.

Accordingly, there is a need in the art to provide an apparatus and method that allows for the efficient, secure mechanical attachment of circuit boards and the like, to chassises or frames without the use of screws or other conventional fasteners going through holes in the circuit board. Moreover, there is a further need for an apparatus and method for efficiently securing circuit boards to chassises and the like, that is adjustable.

SUMMARY OF THE INVENTION

The foregoing needs are met, to a great extent, by the present invention, wherein in one aspect a circuit board clip apparatus is provided, comprising a base having a longitudinal axis, a first end and a second end. The clip apparatus also includes a bore that extends between the first end and the second end of the base. The clip apparatus also includes a first leg coupled to the base that extends generally parallel to the longitudinal axis. The first leg has an indent that has a first finger portion and a second finger portion. The first and second finger portions extend from the first leg at an angle to the longitudinal axis in a generally opposing relationship.

In accordance with another embodiment of the present invention, a circuit board clip apparatus is provided, comprising a base having a longitudinal axis, a first end and a second end. The clip apparatus also includes a first bore having a first diameter, wherein the first bore extends at least partially between the first end and the second end of the base. The clip apparatus includes a second bore having a second diameter, wherein the second bore extends at least partially between the first and second end. The clip apparatus also includes a first leg coupled to the base that extends generally parallel to the longitudinal axis. The first leg has an indent that has a first finger portion and a second finger portion. The first and second finger portions extend from the first leg at an angle to the longitudinal axis in a generally opposing relationship.

In accordance with yet another embodiment of the present invention, a circuit board clip apparatus is provided having a means for attaching a circuit board to a chassis or the like. The means for attaching includes a longitudinal axis and a base having a first end and a second end. The means for attaching also includes a bore that extends between the first end and the second end of the base. The means for attaching also includes a leg coupled to the base that extends generally parallel to the longitudinal axis. The leg comprises an indent having a first finger portion and a second finger portion. The first and second finger portions extend from the leg at an angle to the longitudinal axis in a generally opposing relationship. The means for attaching also includes a mechanical attachment means disposed within the bore.

In accordance with another embodiment of the present invention, a circuit board clip apparatus is provided comprising a base having a longitudinal axis, wherein the base includes a first end and a second end. The clip apparatus also includes a bore that extends between said first end and said second end of the base along with a leg coupled to the base. The leg extends generally parallel to the longitudinal axis, wherein the leg comprises a finger portion, and the finger portion extends from said first leg at toward the base.

In accordance with still another embodiment of the present invention, a method for mounting a circuit board to a chassis or the like is provided, comprising the steps of: attaching at least one clip to the circuit board, wherein the clip comprises: a longitudinal axis, wherein said base comprises a first end and a second end; a bore that extends between said first end and said second end of said base; a first leg coupled to said base that extends generally parallel to the longitudinal axis, wherein said first leg comprises an indent, said indent comprising a first finger portion and a second finger portion, wherein said first and second finger portions extend from said first leg at an angle to the longitudinal axis in a generally opposing relationship; inserting a screw through the chassis or the like and into the bore; and rotating the screw.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 3 is perspective view of a side mounted clip apparatus in accordance with another embodiment of the present invention.

FIG. 4 is a perspective view of a corner mounted clip apparatus in accordance with an alternative embodiment of the present invention.

DETAILED DESCRIPTION

Figure 1:
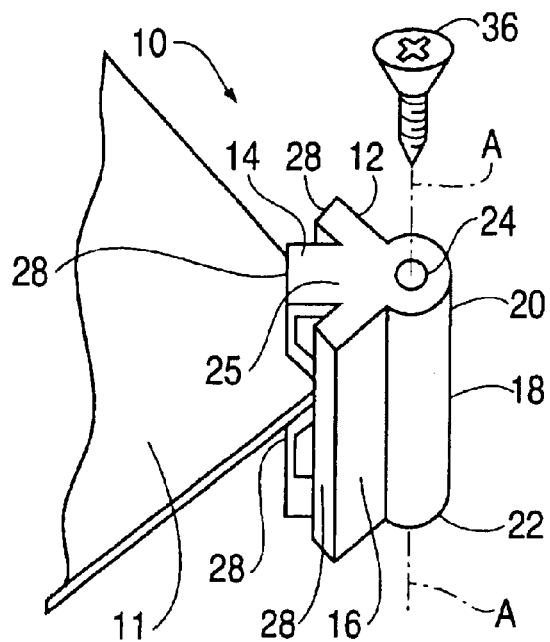
FIG. 1 is perspective view of a corner mounted clip apparatus in combination with a portion of a circuit board in accordance with an embodiment of the present invention.

Various preferred embodiments of the present invention provide for a clip apparatus and method for the attachment of circuit boards and the like to chassises or other like framework. The clips can include for example, corner clips and side clips used to mount and support a circuit board. In some arrangements, the apparatus and method are utilized in combination with mounting screws and nuts while in other arrangements the mounting screws and nuts are not employed. It should be understood, however, that the present invention is not limited in its application to circuit boards, computers or electronics, but, for example, can be used with other manufacturing processes and industries that required the mounting components or electronics to framework. Preferred embodiments of the invention will now be further described with reference to the drawing figures, in which like reference numerals refer to like parts.

Figure 2:
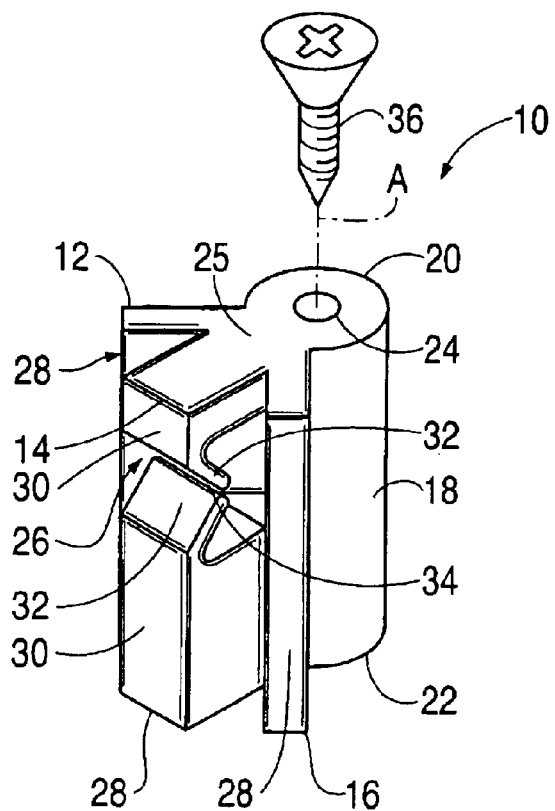
FIG. 2 is a perspective view of the corner mounted clip apparatus depicted in FIG. 1 with the circuit board removed.

Referring now to the figures, FIGS. 1 and 2 illustrate a clip apparatus, generally designated 10, in combination with a circuit board 11 in accordance with an embodiment of the present invention. The clip apparatus 10 is preferably utilized in combination with a corner portion of a circuit board and therefore may be designated as a "corner clip." The clip 10, generally includes three leg members, a first leg 12, a second leg 14 and a third leg 16, that each extend outward away from a cylindrical barrel portion or base 18. The base 18 has a first end 20 and a second end 22 along with an inner bore 24. As illustrated in FIGS. 1 and 2, the inner bore 24 extends between the first 20 and second 22 ends within the base 18. The base 18 also has a longitudinal axis A.

As depicted in FIGS. 1 and 2, the legs 12, 14, 16 preferably extended along the entire length of the cylindrical barrel portion or base 18 in the vertical direction, generally parallel to the to the longitudinal axis A. The legs 12, 14, 16 have a common coupled end 25 and a distal end 28. The legs 12, 14, 16 are preferably integral with the cylindrical barrel portion or base 18 to form a unitary clip 10. The legs 12, 14, 16 may alternatively be separate components from the cylindrical barrel portion or base 18 and attached via mechanical attachment.

As illustrated, the first 12 and third 16 legs extend outward, away from the cylindrical barrel portion or base 18 at a generally 90 degree angle to one another. The second leg 14 bifurcates this angle as illustrated. The legs 12, 16 may alternatively extend outward, away from the cylindrical barrel portion 18 at an angle less than 90 degrees or more than 90 degrees to one another, depending upon the shape and size of the circuit board 11 with which the clip 10 is utilized.

Referring now specifically to FIG. 2, the second leg 14, like the other legs 12 and 16, extends the length of the cylindrical barrel portion or base 18 in the vertical direction, generally parallel to the to the longitudinal axis A. However, as illustrated, the leg 14 includes a recess or indent, generally designated 26, located at approximately the mid-section of the leg 14, through which a portion of the circuit board 11 extends, as illustrated in FIG. 1. As depicted in FIG. 2, the leg 14 includes two gripper or finger portions 30, that each extend off of the leg 14 in opposing relationship. As illustrated, the finger portions 30 extend toward one another, generally parallel to the base 18, and have a flexible tip portion 32 that extends or is angled toward the base 18. The finger portions 30 form an opening 34 through which the clip 10 engages the circuit board 11, coupling the clip 10 to the circuit board.

Alternative embodiments covered by the disclosed invention may include a recess or indent that includes only a single gripper or finger portion 30. In such embodiments, the leg 14 includes either an upper finger portion 30 or a lower finger portion that traps or biases a portion of the circuit board against an opposing portion of the leg 14.

The opening 34 defined by the finger portions 30 is typically slightly less than the circuit board thickness. Moreover, the opening 34 ranges in size from approximately 0.040" to approximately 0.080." More preferably, the opening 34 defined by the finger portions 30 preferably is 0.058". Alternatively, the opening 34 may be modified to be smaller or larger than the aforementioned dimensions to accommodate circuit boards of various sizes and/or thicknesses.

As depicted in FIGS. 1 and 2, the cylindrical barrel portion or base 18 has a substantially round or circular cross section. The cylindrical barrel portion or base 18 is coupled to a chassis or the like to provide a connection for the circuit board 11. The illustrated cylindrical barrel portion or base 18 includes first 20 and second 22 ends with an inner bore 24 extending there between as previously described. The inner bore 24 provides openings in both ends 20, 22 of the cylindrical barrel portion or base 18 through which a fastener 36, such as a machine screw, may extend, coupling the cylindrical barrel portion or base 18 to the chassis.

Referring now to FIG. 3, another circuit board clip apparatus in accordance with an embodiment of the present invention, generally designated 38, is depicted. The circuit board clip apparatus 38, in contrast to the embodiment of the clip 10 depicted in FIGS. 1 and 2, is preferably utilized in combination with a side portion or NON-corner portion of a circuit board and may be designated as a "side clip." As illustrated, the side clip 38 includes only the leg member 14 which extends outward away from the cylindrical barrel portion or base 18, generally parallel to the longitudinal axis A as previously described. The leg 14 is preferably integral with the cylindrical barrel portion 18 or base, however the leg 14 and cylindrical barrel portion or base 18 may be separate if desired.

As previously described in connection with the embodiment depicted in FIGS. 1 and 2, the leg 14 includes the recess or indent 26 located at approximately the mid-section of the leg 14. The leg 14 includes two gripper or finger portions 30 extending off of the leg 14 in opposing relationship. As illustrated, the finger portions 30 extend toward one another, generally parallel to the base 18 and each have a flexible tip portion 32 that extends or is angled toward the base 18. As previously described, the finger portions 30 form the opening 34 through which the side clip 38 engages the circuit board 11, coupling the side clip 38 to the circuit board.

Alternative embodiments of the side clip 38 covered by the disclosed invention may include a recess or indent that includes only a single gripper or finger portion 30. In such embodiments, the leg 14 includes either an upper finger portion or a lower finger portion, that traps or biases a portion of the circuit board against an opposing portion of the leg 14.

Again, the opening 34 is typically slightly less than the thickness of the circuit board. The opening 34 generally ranges in size from approximately 0.040" to approximately 0.080". More preferably, the opening 34 defined by the finger portions 30 preferably is 0.058". Alternatively, the opening 34 may be modified to be smaller or larger than the aforementioned dimensions to fit circuit boards of various sizes and/or thicknesses.

During installation of a circuit board in a chassis or the like, a corner clip 10 is preferably placed on two opposing corners of the circuit board while a side clip 38 is placed on two opposing sides of the circuit board. Alternatively, depending upon the chassis to which the circuit board is being mounted, the end user may employ more or less corner clips 10 and/or side clips 38. The clips 10, 38 are then fastened to the chassis by inserting the screw through a hole in the chassis and into the bore and rotating the screw 36.

Figure 5:
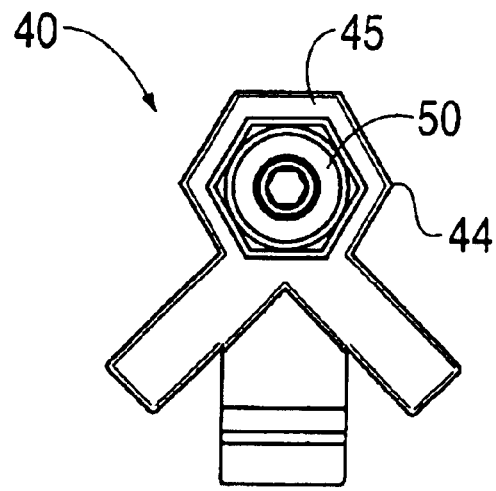
FIG. 5 is a top view of the corner mounted clip apparatus depicted in FIG. 4 in accordance with an embodiment of the present invention.
Figure 6:
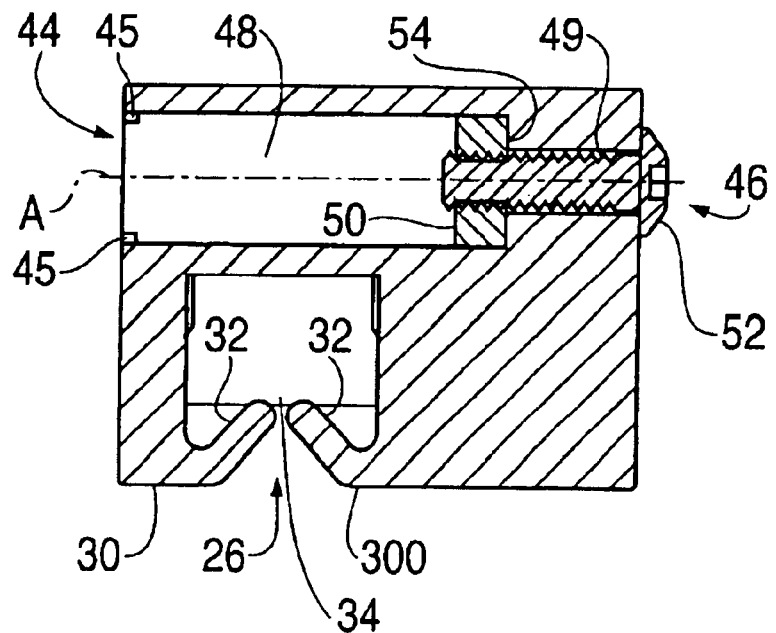
FIG. 6 is a sectional view of clip apparatus depicted in FIG. 5 taken along line A—A.

Referring now to FIGS. 4–6, an alternative embodiment, generally designated 40, of a clip preferably utilized in combination with a corner portion of a circuit board, is depicted. As indicated by like reference numerals, the corner clip 40 includes similar features to that of the previously described embodiments. The corner clip 40 includes three leg members 12, 14, 16 that each extend outward away from a barrel portion or base 42. The leg members 12, 14, 16 also extend along the entire length of the barrel portion or base 42, generally parallel to the longitudinal axis A. However, as illustrated, the barrel portion or base 42 of the embodiment depicted in FIGS. 4–6, is generally octagon in shape and orientation.

The barrel portion or base 42 has a first end 44 and a second end 46 with and a first bore 48 having a first diameter and a second bore 49 having a second diameter. As illustrated, the bores 48, 49 to extend between the first end 44 and the second end 46. The first end 44 includes a lip or edge 45. As illustrated in FIGS. 4–6, the corner clip includes a nut 50 and screw 52. The nut 50 is preferably retained or trapped within the bore 48 as illustrated in FIGS. 5 and 6. The nut 50 is preferably retained such that it is prevented from rotating about the longitudinal axis A. However, the nut 50 may slide or move along the longitudinal axis A within the bore 48, if desired, when not engage by the screw 52. Also, when not engaged by the screw 52, the nut 50 is retained within the bore 48 and prevented from being dislodged from the bore 48, by the lip 45.

As illustrated in FIG. 6, the screw 52 is retained within the second bore 49 and engages the nut 50 via screw connection or attachment. The screw 52 preferably extends from the second end 46, through the second bore 49 and into the first bore 48 where it engages the nut 50.

Again, as previously described, the first 12 and third 16 legs extend outward, away from the barrel portion or base 42 at a generally 90 degree angle to one another, as illustrated in FIGS. 4–6. The second leg 14 bifurcates this angle. The legs 12, 16 may alternatively extend outward, away from the base at an angle less than 90 degrees or more than 90 degrees to one another, depending upon the shape and size of the circuit board 11 with which the clip 40 is utilized.

Referring now specifically to FIG. 6, the second leg 14, like the other legs 12 and 16, extends the length of the base 42 in the vertical direction, generally parallel to the longitudinal axis A. However, as illustrated, the leg 14 includes a recess or indent, generally designated 26, located at approximately the mid-section of the leg 14, through which a portion of the circuit board extends. As depicted in FIG. 6, the leg 14 includes two gripper or finger portions 30 extending off of the leg 14 in opposing relationship. As illustrated, the finger portions 30 extend toward one another, generally parallel to the base 44 and have a flexible tip portion 32 that extends or is angled toward the base 44. The finger portions 30 form an opening 34 through which the clip 40 engages a circuit board, coupling the clip 40 to the circuit board.

Figure 7:
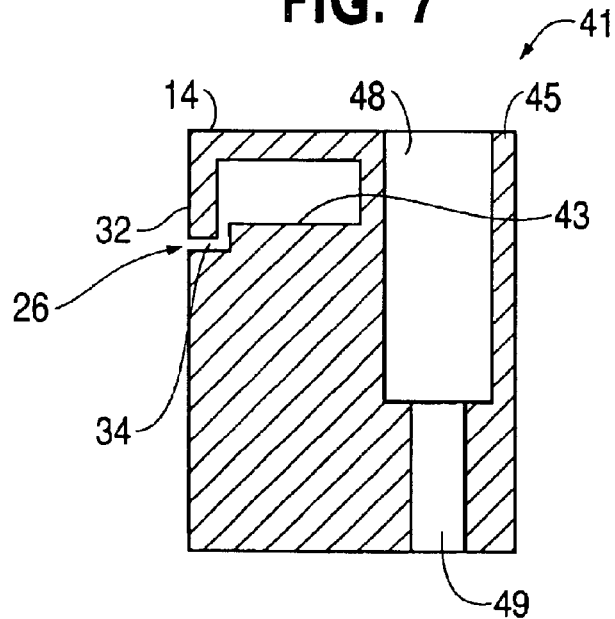
FIG. 7 is a cross-sectional view of clip apparatus in accordance with an embodiment of the present invention.

Alternative embodiments of the circuit board clip apparatus 41 covered by the disclosed invention may include a recess or indent that includes only a single finger portion 32 as illustrated in FIG. 7. In such embodiments, the leg 14 includes either an upper finger portion 32 or lower finger portion 32, depending on the clip 41 orientation, that traps or biases a portion of the circuit board against an opposing portion 43 of the leg 14.

The opening 34 is typically slightly less than the thickness of the circuit board. The opening 34 generally ranges in size from approximately 0.040" to approximately 0.080"." More preferably, the opening 34 defined by the finger portions 30 preferably is 0.058". Alternatively, the opening 34 may be modified to be smaller or larger than the aforementioned dimensions to fit circuit boards of various sizes and/or thicknesses.

Figure 8:
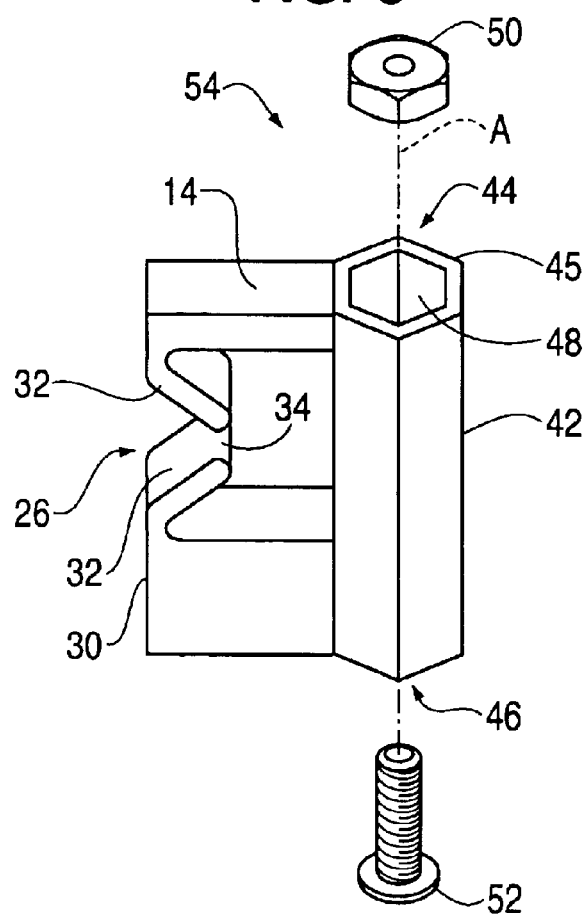
FIG. 8 is a perspective view of a side mounted clip apparatus in accordance with an alternative embodiment of the present invention.

Referring now to FIG. 8, perspective view of another circuit board clip apparatus in accordance with an embodiment of the present invention, generally designated 54, is depicted. The circuit board clip apparatus 54, in contrast to the embodiment of the clip 40 depicted in FIGS. 4–6, is preferably utilized in combination with a side portion or non-corner portion of a circuit board and may be designated as a "side clip." As illustrated, the side clip 54 includes only the leg member 14 which extends outward away from the barrel portion or base 18 generally parallel to the longitudinal axis A as previously described. The leg 14 is preferably integral with the barrel portion or base 18, however the leg 14 and barrel portion 18 or base 18 may be separate if desired.

As previously described in combination with the embodiment depicted in FIGS. 4–6, the leg 14 includes the recess or indent 26 located at approximately the mid-section of the leg 14. The leg 14 includes two gripper or finger portions 30 extending off of the leg 14 in opposing relationship. The finger portions 30 extend toward one another, generally parallel to the base 18 and each have a flexible tip portion 32 that extends or is angled toward the base 18. As previously described, the finger portions 30 form the opening 34 through which the side clip 54 engages the circuit board 11, coupling the side clip 54 to the circuit board.

During installation of a circuit board in a chassis or the like, a corner clip 40 is preferably placed on two opposing corners of the circuit board while a side clip 52 is placed on two opposing sides of the circuit board. Alternatively, depending upon the chassis to which the circuit board is being mounted, the end user may employ more or less corner clips 40 and/or side clips 52. The clips 40, 52 are then attached to the chassis, or the like, via the screw 52 and nut 50, mounting the circuit board to the chassis. During attachment of the clips 40, 52, the screw 52 inserted through a hole in the chassis, for example, and it is then rotated, causing it to engage and attach to the nut 50. As the screw is rotated, the nut 50 is drawn toward the second bore 49 and abuts the shoulder 54. This aforementioned action securely fastens the clips 40, 52, and therefore the circuit board to which the clips 40, 52 are coupled, to the chassis.

Figure 9:
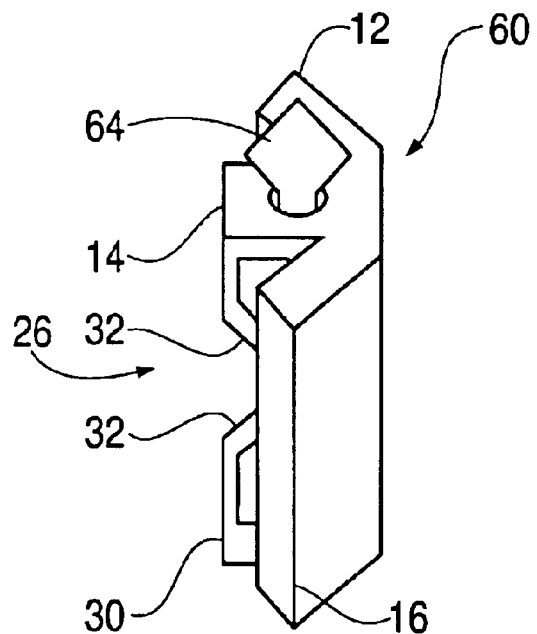
FIG. 9 is a perspective view of a corner mounted clip apparatus in accordance with another alternative embodiment of the present invention.
Figure 10:
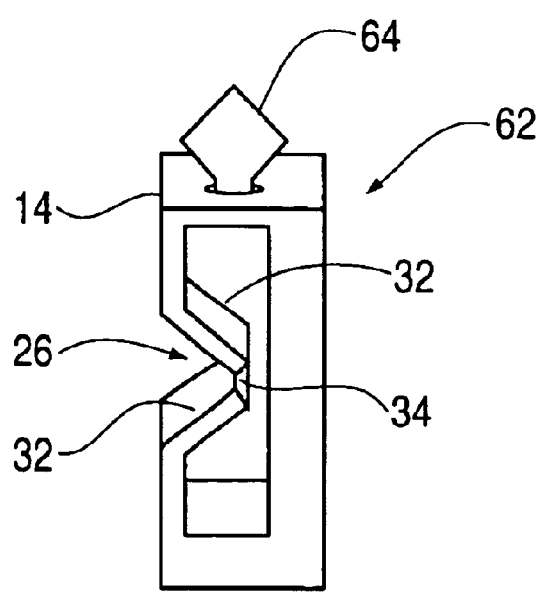
FIG. 10 is a perspective view of a side mounted clip apparatus in accordance with another alternative embodiment of the present invention.

Referring now to FIGS. 9 and 10, a corner clip 60 in accordance with an alternative embodiment of the present invention is illustrated along with a side clip 62 also in accordance with an alternative embodiment of the present invention. Both the corner clip 60 and the side clip 62 include similar features to those of the previously described embodiments as indicated by the like reference numerals, however, as illustrated, the clip apparatuses do not include an inner bore like the previously described embodiments.

The corner clip 60 and the side clip 62 alternatively include a peg portion 64 that engages or contacts a notch or hole in the chassis to attach the corner and side clip, and thus the circuit board, to the chassis. These embodiments of the clips 60, 62 eliminate the need for mechanical attachment means such as a screw and/or bolt.

Figure 11:
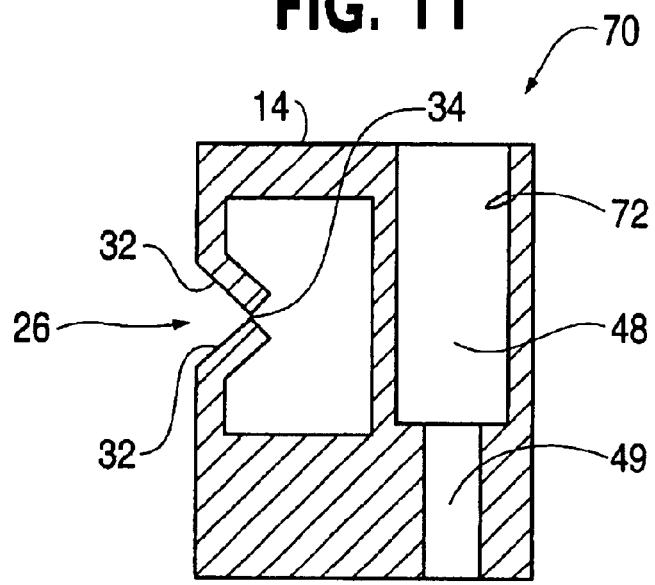
FIG. 11 is a cross-sectional view of a clip apparatus in accordance with an alternative embodiment of the present invention.

Referring now to FIG. 11, a cross-sectional view of a clip 70 in accordance with another alternative embodiment of the present invention is depicted. As indicated by like reference numerals, the clip 70 includes similar features to that of the previously described embodiments. In this embodiment, the clip 70 includes an additional finger or protrusion 72 that extends from bore 48. The finger or protrusion 72 functions to restrain nuts and/or bolts within the bore 48 and prevent the nuts and/or bolts from exiting the bore 48.

Figure 12:
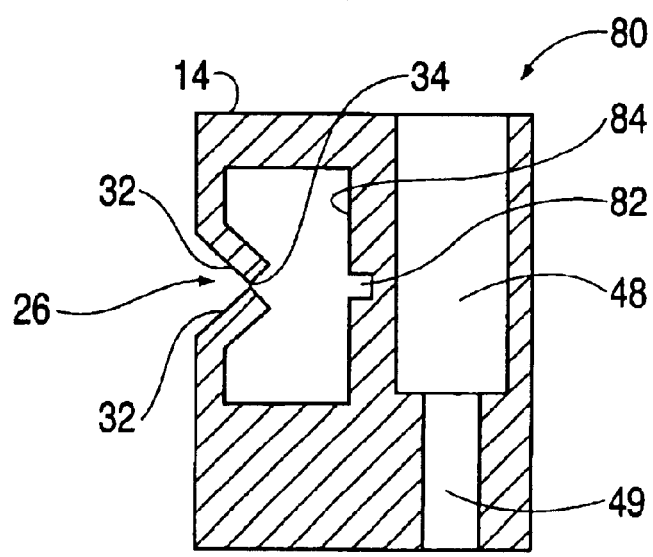
FIG. 12 is a cross-sectional view of a clip apparatus in accordance with another alternative embodiment of the present invention.

Referring now FIG. 12, a cross-sectional view of a clip 80 in accordance with another embodiment of the present invention is depicted. As indicated by like reference numerals, the clip 80 includes similar features to that of the previously described embodiments. The clip 80 also includes a notch 82 in the bore face 84 that opposes the opening 34. In the embodiment depicted, the notch 82 receives and engages the circuit board and assists to restrain the circuit board during high load impacts or events.

The various above-described embodiments of the clip apparatus can be manufactured from various materials known in the art such as metal and/or plastic. The clip apparatuses are preferably manufactured from materials such as nylon, thermoplastic and the like. Moreover, the clip apparatuses are preferably formed via various injection molding processes.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A circuit board clip apparatus, comprising:
   a base having a longitudinal axis, wherein said base comprises a first end and a second end;
   a bore that extends between said first end and said second end of said base;
   a first leg coupled to said base that extends generally parallel to the longitudinal axis, wherein said first leg comprises an indent, said indent comprising a first finger portion and a second finger portion, wherein said first and second finger portions extend from said first leg toward said base in a generally opposing relationship.

2. The circuit board clip apparatus according to claim 1, further comprising:
   a second leg coupled to said base that extends generally parallel to the longitudinal axis;
   a third leg coupled to said base that extends generally parallel to the longitudinal axis, wherein said second and said third legs are positioned at an angle to one another.

3. The circuit board clip apparatus according to claim 2, wherein said angle is equal to approximately 90 degrees.

4. The circuit board clip apparatus according to claim 2, wherein said first leg bifurcates said angle.

5. The circuit board clip apparatus according to claim 1, wherein said finger portions extend to define an opening.

6. The circuit board clip apparatus according to claim 5, wherein said opening size ranges from approximately 0.040" to approximately 0.080".

7. The circuit board clip apparatus according to claim 6, wherein said opening size is equal to approximately 0.058".

8. The circuit board clip apparatus according to claim 1, wherein said base is cylindrical in shape and has a generally circular cross-section.

9. The circuit board clip apparatus according to claim 1, wherein said base is has a generally hexagonal cross-section.

10. The circuit board clip apparatus according to claim 1, further comprising an attachment means that attaches said base to a chassis.

11. The circuit board clip apparatus according to claim 10, wherein said attachment means is a self tapping screw.

12. The circuit board clip apparatus according to claim 10, wherein said attachment means is a screw and bolt.

13. A circuit board clip apparatus, comprising:
  a base having a longitudinal axis, wherein said base comprises a first end and a second end;
  a first bore having a first diameter, said first bore extends at least partially between said first end and said second end of said base;
  a second bore having a second diameter, said second bore extends at least partially between said first end and said second end; and
  a first leg coupled to said base that extends generally parallel to the longitudinal axis, wherein said first leg comprises an indent, said indent comprising a first finger portion and a second finger portion, wherein said first and second finger portions extend from said first leg toward said base in a generally opposing relationship.

14. The circuit board clip apparatus according to claim 13, further comprising:
  a nut disposed within said first bore; and
  a screw disposed within said second bore.

15. The circuit board clip apparatus according to claim 13, further comprising:
  a second leg coupled to said base that extends generally parallel to the longitudinal axis;
  a third leg coupled to said base that extends generally parallel to the longitudinal axis, wherein said second and said third legs are positioned at an angle to one another.

16. The circuit board clip apparatus according to claim 15, wherein said angle is equal to approximately 90 degrees.

17. The circuit board clip apparatus according to claim 15, wherein said first leg bifurcates said angle.

18. The circuit board clip apparatus according to claim 13, wherein said finger portions extend to define an opening.

19. The circuit board clip apparatus according to claim 18, wherein said opening size ranges from approximately 0.040" to approximately 0.080".

20. The circuit board clip apparatus according to claim 19, wherein said opening size is equal to approximately 0.058".

21. The circuit board clip apparatus according to claim 13, wherein said base is has a generally hexagonal cross-section.

22. The circuit board clip apparatus according to claim 13, further comprising a notch that opposes said indent.

23. The circuit board clip apparatus according to claim 13, further comprising a third finger portion that extends from said first bore.

24. A method for mounting a circuit board to a chassis, comprising:
  attaching at least one clip to the circuit board, wherein the clip has a longitudinal axis, wherein said clip comprises:
    a base, wherein said base comprises a first end and a second end;
    a bore that extends between said first end and said second end of said base; and
    a first leg coupled to said base that extends generally parallel to the longitudinal axis, wherein said first leg comprises an indent, said indent comprising a first finger portion and a second finger portion, wherein said first and second finger portions extend from said first leg toward the base in a generally opposing relationship;
  inserting a screw through the chassis and into the bore; and
  rotating the screw.

25. A circuit board clip apparatus, comprising:
  means for attaching to a circuit board, wherein said means for attaching comprises:
    a base having a longitudinal axis, wherein the base comprises a first end and a second end;
    a bore that extends between the first end and the second end of the base;
    a leg coupled to the base that extends generally parallel to the longitudinal axis, wherein the leg comprises an indent, the indent comprising a first finger portion and a second finger portion, wherein the first and second finger portions extend from the first leg toward the base in a generally opposing relationship; and
  mechanical attachment means for attaching to a chassis or the like disposed within the bore.

26. The circuit board clip apparatus according to claim 25, further comprising:
  a second leg coupled to said base that extends generally parallel to the longitudinal axis; and
  a third leg coupled to said base that extends generally parallel to the longitudinal axis, wherein said second and said third legs are positioned at an angle to one another.

27. The circuit board clip apparatus according to claim 26, wherein said angle is equal to approximately 90 degrees.

28. The circuit board clip apparatus according to claim 26, wherein said first leg bifurcates said angle.

29. A circuit board clip apparatus, comprising:
  a base having a longitudinal axis, wherein said base comprises a first end and a second end;
  a bore that extends between said first end and said second end of said base; and
  a first leg coupled to said base that extends generally parallel to the longitudinal axis, wherein said first leg comprises a finger portion, wherein said finger portion extends from said first leg toward said base.

30. The circuit board clip apparatus according to claim 29, wherein said base is cylindrical in shape and has a generally circular cross-section.

31. The circuit board clip apparatus according to claim 29, wherein said base is has a generally hexagonal cross-section.

* * * * *

UNITED STATES PATENT AND TRADEMARK OFFICE
CERTIFICATE OF CORRECTION

| | |
|---|---|
| PATENT NO. | : 6,864,433 B1 |
| DATED | : March 8, 2005 |
| INVENTOR(S) | : Barry A. Fetzer et al. |

It is certified that error appears in the above-identified patent and that said Letters Patent is hereby corrected as shown below:

Column 9,
Line 12, please delete "is";

Column 10,
Lines 37 and 38, please delete "or the like";

Signed and Sealed this

Seventeenth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,864,433 B1
DATED : March 8, 2005
INVENTOR(S) : Barry A. Fetzer et al.

It is certified that error appears in the above-identified patent and that said Letters Patent is hereby corrected as shown below:

Column 10,
Line 65, please delete "is".

Signed and Sealed this

Twelfth Day of July, 2005

JON W. DUDAS
*Director of the United States Patent and Trademark Office*